(12) United States Patent
Lei et al.

(10) Patent No.: US 11,804,831 B2
(45) Date of Patent: Oct. 31, 2023

(54) NMOS SWITCH DRIVING CIRCUIT AND POWER SUPPLY DEVICE

(71) Applicant: SHENZHEN CARKU TECHNOLOGY CO., LIMITED, Guangdong (CN)

(72) Inventors: Yun Lei, Guangdong (CN); Zhifeng Zhang, Guangdong (CN); Jianmeng Wu, Guangdong (CN); Changxi Chen, Guangdong (CN)

(73) Assignee: Shenzhen Carku Technology Co., Limited, Shenzhen (CN)

( * ) Notice: Subject to any disclaimer, the term of this patent is extended or adjusted under 35 U.S.C. 154(b) by 0 days.

(21) Appl. No.: 17/082,715

(22) Filed: Oct. 28, 2020

(65) Prior Publication Data
US 2021/0135663 A1 May 6, 2021

(30) Foreign Application Priority Data

Nov. 4, 2019 (CN) .......................... 201911066522.0

(51) Int. Cl.
H03K 17/0812 (2006.01)
H03K 17/687 (2006.01)
H03K 17/00 (2006.01)

(52) U.S. Cl.
CPC ....... *H03K 17/0812* (2013.01); *H03K 17/005* (2013.01); *H03K 17/6871* (2013.01);
(Continued)

(58) Field of Classification Search
CPC ........ F02D 41/00; F02D 41/1402; F02P 3/00; F02P 3/0453; F02P 3/053; H02M 1/00;
(Continued)

(56) References Cited

U.S. PATENT DOCUMENTS

2009/0014669 A1 1/2009 Sato et al.
2010/0149840 A1* 6/2010 Hayasaki ................. B41J 2/435
363/21.09
(Continued)

FOREIGN PATENT DOCUMENTS

JP H05243950 A 9/1993
JP 2004312486 A 11/2004
(Continued)

OTHER PUBLICATIONS

The Extended European Search Report issued in corresponding EP Application No. EP 20205119.9, dated Apr. 9, 2021.
(Continued)

*Primary Examiner* — William Hernandez
(74) *Attorney, Agent, or Firm* — Hauptman Ham, LLP

(57) ABSTRACT

An NMOS switch driving circuit and a power supply device are provided. The NMOS switch driving circuit includes a power-supply unit, a switch unit, a power conversion unit, and a driving unit. The power-supply unit is configured to output a first voltage. The switch unit is electrically coupled between the power-supply unit and a first interface and configured to establish or disconnect an electrical coupling between the power-supply unit and the first interface. The power conversion unit includes a port coupled to the power-supply unit and another port electrically coupled to the switch unit via the driving unit. The power conversion unit is configured to convert the first voltage into a constant driving voltage and output the driving voltage to the switch unit via the driving unit to drive the switch unit to be switched on, to establish the electrical coupling between the power-supply unit and the first interface.

20 Claims, 4 Drawing Sheets

(52) U.S. Cl.
CPC . *H03K 17/6877* (2013.01); *H03K 2217/0027* (2013.01); *H03K 2217/0081* (2013.01)

(58) Field of Classification Search
CPC ............ H02M 1/08; H02M 1/32; H02M 3/00; H02M 3/33523; H02M 3/33553; H03K 17/00; H03K 17/005; H03K 17/04123; H03K 17/063; H03K 17/08104; H03K 17/0812; H03K 17/08122; H03K 17/687; H03K 17/6871; H03K 17/6874; H03K 17/6877; H03K 17/689; H03K 17/725; H03K 17/7955; H03K 2217/00; H03K 2217/0027; H03K 2217/0063; H03K 2217/0081
USPC ....... 327/376, 108, 109, 365, 379, 383, 419, 327/434, 436
See application file for complete search history.

(56) References Cited

U.S. PATENT DOCUMENTS

| | | | | |
|---|---|---|---|---|
| 2014/0001885 | A1* | 1/2014 | Xiao | H03K 17/962 |
| | | | | 307/116 |
| 2014/0301114 | A1* | 10/2014 | Matsumoto | G03G 15/80 |
| | | | | 399/88 |
| 2016/0373012 | A1* | 12/2016 | Freeman | H02M 3/073 |
| 2018/0011503 | A1* | 1/2018 | Butler | G05F 1/44 |
| 2019/0199103 | A1* | 6/2019 | Kawano | H02J 7/00714 |
| 2019/0393707 | A1* | 12/2019 | Hunter | H02J 7/0016 |
| 2020/0280313 | A1* | 9/2020 | Rinne | H02M 1/08 |
| 2022/0393591 | A1* | 12/2022 | Li | H02M 3/158 |

FOREIGN PATENT DOCUMENTS

| | | |
|---|---|---|
| JP | 2008244972 A | 10/2008 |
| JP | 2017092695 A | 5/2017 |
| JP | 6497475 B1 | 4/2019 |
| JP | 2019115166 A | 7/2019 |
| WO | 2013084017 A1 | 6/2013 |

OTHER PUBLICATIONS

Bhatt Ashutosh: "Designing Open Loop Isolated Flyback Converter", Apr. 21, 2008 (Apr. 21, 2008), XP055789220, Retrieved from the Internet: URL:https://www.engineersgarage.com/electronic-projects/designing-open-loop-isolated-flyback-converter/ [retrieved on Mar. 23, 2021] p. 2.

The First Office Action issued in corresponding KR Application No. KR10-2020-0143618, dated Nov. 24, 2021.

The First Office Action issued in corresponding JP Application No. JP2020-183477, dated Nov. 19, 2021.

* cited by examiner

NMOS SWITCH DRIVING CIRCUIT AND POWER SUPPLY DEVICE

CROSS-REFERENCE TO RELATED APPLICATION(S)

This application claims priority to Chinese Patent Application No. 201911066522.0, filed on Nov. 4, 2019, the disclosure of which is hereby incorporated by reference in its entirety.

TECHNICAL FIELD

This disclosure relates to the technical field of circuits, and particularly to an N-channel metal oxide semiconductor (NMOS) switch driving circuit and a power supply device.

BACKGROUND

With the development of microelectronics technology, N-channel metal-oxide-semiconductor field-effect transistors (MOSFETs) have significant advantages over triodes or P-channel MOSFETs in high-frequency, high-power, and high-efficiency switching application scenarios. According to device characteristics of the N-channel MOSFET, a voltage signal higher than that of the source of the N-channel MOSFET is applied on the gate of the N-channel MOSFET, to control the drain and source of the N-channel MOSFET to be effectively switched on. A voltage of the gate of the N-channel MOSFET is set to follow a voltage of the source of the N-channel MOSFET, to control the drain and source of the N-channel MOSFET to be effectively switched off.

In the existing NMOS switch driving circuit, an NMOS switch is coupled between a power supply and a load. When a voltage of the power supply fluctuates up and down, a driving voltage of the NMOS switch will also experience wide fluctuations in voltage drop (i.e., dropping or rising), which may cause the driving voltage to fail to meet a conduction condition of the NMOS switch, for example, the NMOS switch is caused to be in a semi-conductive state (i.e., work in a linear region), and an internal resistance of the NMOS switch increases, resulting in serious heating of the NMOS switch; or the driving voltage is caused to exceed withstand voltages of the gate and source of the NMOS switch, as a result, the NMOS switch is broken down, short-circuited, or burnt out.

SUMMARY

An N-channel metal oxide semiconductor (NMOS) switch driving circuit and a power supply device are provided, which can provide a stable driving voltage, thereby ensuring normal drive of an active NMOS switch, prolonging lifetime of the NMOS switch, and improving stability of performance of the NMOS switch driving circuit.

In a first aspect of the disclosure, an NMOS switch driving circuit is provided. The NMOS switch driving circuit is applicable to a power supply device equipped with a first interface and a second interface. The NMOS switch driving circuit includes a power-supply unit, a switch unit, a power conversion unit, and a driving unit. The power-supply unit is configured to output a first voltage. The switch unit is electrically coupled between the power-supply unit and the first interface, and is configured to establish or disconnect an electrical coupling between the power-supply unit and the first interface, where the switch unit comprises at least one NMOS switch. The power conversion unit includes a port coupled to the power-supply unit and another port electrically coupled to the switch unit via the driving unit. The power conversion unit is configured to convert the first voltage into a constant driving voltage and output the constant driving voltage to the switch unit via the driving unit to drive the switch unit to be switched on, to establish the electrical coupling between the power-supply unit and the first interface.

In a second aspect of the disclosure, a power supply device is provided. The power supply device includes a first interface and a second interface. The power supply device further includes the NMOS switch driving circuit of the first aspect, the NMOS switch driving circuit is coupled to a load via the first interface and the second interface.

According to the NMOS switch driving circuit and the power supply device of the disclosure, since the power conversion unit configured to convert the first voltage into the constant driving voltage and output the constant driving voltage to the switch unit is included, that is, even if the first voltage fluctuates up and down, the NMOS switch will also receive a stable driving voltage without being affected by fluctuation of the first voltage outputted by the power-supply unit at the front end, thereby ensuring effective driving of the switch unit, prolonging lifetime of the switch unit, and improving stability of performance of the NMOS switch driving circuit. In addition, it is beneficial to preventing the switch unit from being broken down and damaged due to excessively high driving voltage or preventing the switch unit from being seriously heated due to excessively low driving voltage.

BRIEF DESCRIPTION OF THE DRAWINGS

In order to describe technical solutions of implementations of the disclosure more clearly, the following will give a brief description of accompanying drawings used for describing the implementations. Apparently, accompanying drawings described below are merely some implementations. Those of ordinary skill in the art can also obtain other accompanying drawings based on the accompanying drawings described below without creative efforts.

DETAILED DESCRIPTION

Hereinafter, technical solutions embodied by the implementations of the disclosure will be described in a clear and comprehensive manner with reference to the accompanying drawings intended for the implementations of the disclosure. It is evident that the implementations described herein constitute merely some rather than all the implementations of the disclosure, and that those of ordinary skill in the art will be able to derive other implementations based on these implementations without making creative efforts, which all such derived implementations shall all fall in the protection scope of the disclosure.

When an element is described as "coupled" or "connected" to another element, the element may be directly connected or coupled to another element or may be connected or coupled to another element via an intermediate element. Unless the context clearly indicates otherwise, all technical and scientific terms used herein should have the same meaning as commonly understood by those skilled in the technical field of the disclosure. The terms used in the description of the disclosure herein aim to describe specific implementations, which however are not intended to limit the disclosure.

According to the disclosure, a power supply device and an N-channel metal oxide semiconductor (NMOS) switch driving circuit applicable to the power supply device are provided. The NMOS switch driving circuit is coupled to a load, so that the power supply device can supply power to the load when an NMOS switch is switched on. By adopting the NMOS switch driving circuit of implementations of the disclosure, stability of performance of the NMOS switch driving circuit during operation can be improved. Hereinafter, implementations of the disclosure will be described in detail with reference to the accompanying drawings.

Figure 1:
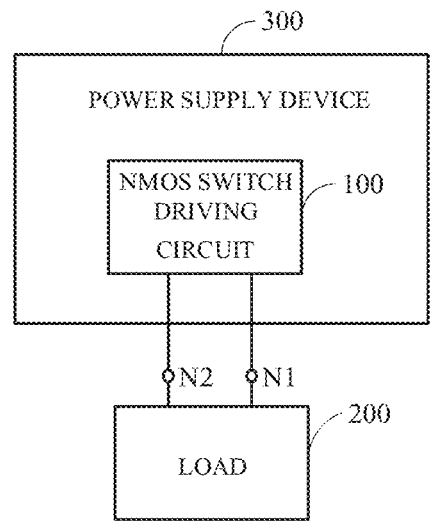
FIG. 1 is a schematic block diagram illustrating a power supply device according to some implementations of the disclosure.

According to implementations of the disclosure, a power supply device 300 is provided. The power supply device 300 is coupled to a load 200 to supply power to the load 200. As illustrated in FIG. 1, the power supply device 300 includes an NMOS switch driving circuit 100, and is equipped with a first interface N1 and a second interface N2. The NMOS switch driving circuit 100 is coupled to the load 200 via the first interface N1 and the second interface N2, where the first interface N1 and the second interface N2 may exist in the form of wiring terminals, which is not limited herein.

In these implementations of the disclosure, the power supply device 300 may be an emergency starting power supply, and the load 200 may be a storage battery (battery) in a car. Since the car battery is coupled to a car engine, after the emergency starting power supply is coupled to the car battery, the emergency starting power supply and the car battery can jointly provide a starting current to the car engine to start the car in an emergency. In other implementations, the power supply device 300 is another type of power supply (e.g., a power-tool power supply), which is not limited herein.

Figure 2:
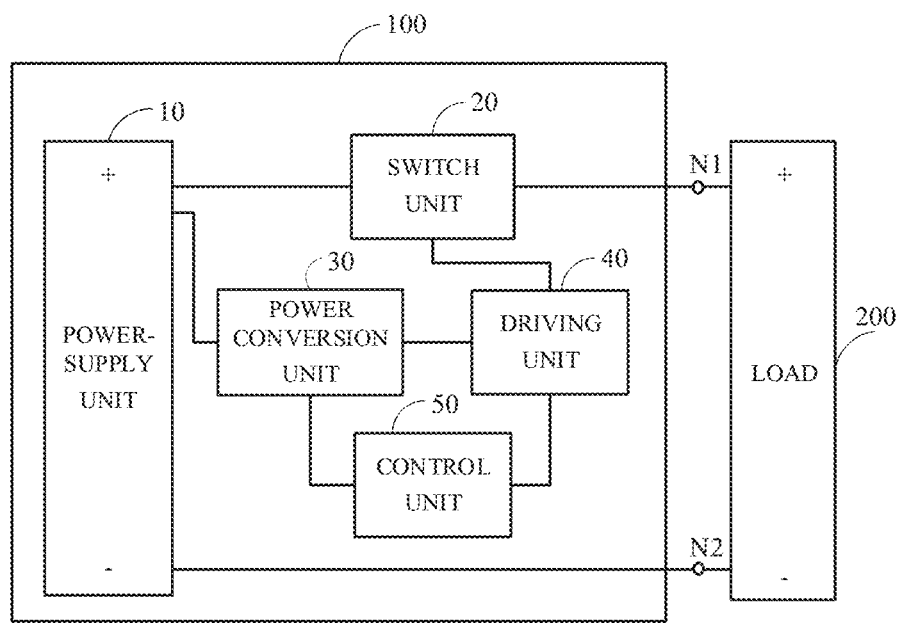
FIG. 2 is a schematic block diagram illustrating an N-channel metal oxide semiconductor (NMOS) switch driving circuit according to some implementations of the disclosure.

FIG. 2 is a schematic block diagram illustrating an NMOS switch driving circuit 100 according to some implementations of the disclosure. As illustrated in FIG. 2, the NMOS switch driving circuit 100 includes a power-supply unit 10, a switch unit 20, a power conversion unit 30, and a driving unit 40.

The power-supply unit 10 is configured to output a first voltage. In one implementation, the power-supply unit 10 includes a battery pack (not illustrated). Specifically, the battery pack may include one or more battery modules coupled together. Each battery module may include at least one battery cell (single battery). For example, the battery cell may be a light, energy-saving, and environmentally-friendly lithium ion battery. In one implementation, the multiple battery modules can be combined in series and parallel to provide an output voltage and output current of the power-supply unit 10. It can be understood that, the first voltage will change as the power-supply unit 10 is used or when the load 200 is activated.

The switch unit 20 is electrically coupled between the power-supply unit 10 and the first interface N1 and includes at least one NMOS switch. The switch unit 20 is configured to establish or disconnect an electrical coupling between the power-supply unit 10 and the first interface N1. In the implementation, the first interface N1 is a positive interface terminal, and the switch unit 20 is connected between a positive electrode of the power-supply unit 10 and the first interface N1. The second interface N2 is a negative interface terminal, and a negative electrode of the power-supply unit 10 is coupled to the second interface N2.

The power conversion unit 30 includes a port coupled to the power-supply unit 10, and another port electrically coupled to the switch unit 20 via the driving unit 40. The power conversion unit 30 is configured to receive the first voltage outputted by the power-supply unit 10, convert the first voltage into a constant driving voltage, and output the constant driving voltage to the switch unit 20 via the driving unit 40 to drive the switch unit 20 to be switched on.

For the NMOS switch driving circuit 100 of the implementations of the disclosure, since the power conversion unit 30 configured to convert the first voltage into the constant driving voltage and output the constant driving voltage to the switch unit 20 is included, that is, even if the first voltage fluctuates up and down, the NMOS switch will also receive a stable driving voltage without being affected by fluctuation of the first voltage outputted by the power-supply unit 10 at the front end, thereby ensuring effective driving of the switch unit 20, prolonging lifetime of the switch unit 20, and improving stability of performance of the NMOS switch driving circuit 100. In addition, it is beneficial to preventing the switch unit 20 from being broken down and damaged due to excessively high driving voltage or preventing the switch unit 20 from generating a lot of heat due to excessively low driving voltage.

Since the power supply device 300 of the implementations of the disclosure includes the above-mentioned NMOS switch driving circuit 100, a stable working voltage can be provided for the load 200. As such, performance and quality of the power supply device 300 can be improved.

In one implementation, in order to achieve effective control of the switch unit 20, the NMOS switch driving circuit 100 further includes a control unit 50. The control unit 50 is electrically coupled to the power conversion unit 30 and the driving unit 40 respectively. The control unit 50 is configured to output a conversion signal to the power conversion unit 30. The control unit 50 is further configured to output a driving signal to the driving unit 40. The power conversion unit 30 is configured to convert the first voltage into the driving voltage according to the conversion signal. The driving unit 40 is configured to output the driving voltage to the switch unit 20 according to the driving signal, so as to drive the switch unit 20 to be switched on. The conversion signal may be a high-level signal or a low-level signal, and the driving signal may be a high-level signal or a low-level signal, which are not limited herein.

In the implementation, the control unit 50 may be a programmable microcontroller. The control unit 50 may include multiple signal acquisition ports, communication ports, control output, and so on.

Figure 3:
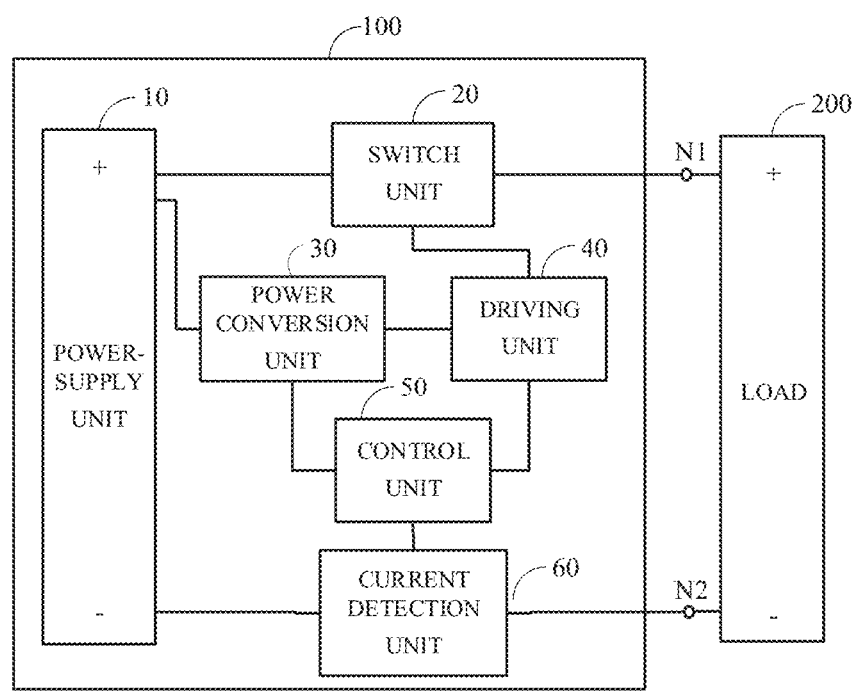
FIG. 3 is a schematic block diagram illustrating an NMOS switch driving circuit according to other implementations of the disclosure.

Different from the foregoing implementations (i.e., the implementations with reference to FIG. 2), in another implementation, as illustrated in FIG. 3, the NMOS switch driving circuit 100 further includes a current detection unit 60. The current detection unit 60 is electrically coupled between a negative electrode of the power-supply unit 10 and the second interface N2, and is configured to detect an output current of the power-supply unit 10. The control unit 50 is further electrically coupled to the current detection unit 60 to collect a current signal detected by the current detection unit 60. When the current signal collected by the control unit 50 is greater than a preset threshold, the control unit 50 stops outputting the conversion signal and/or the driving signal.

If the current signal detected by the current detection unit 60 is greater than the preset threshold, it indicates that a fault or short circuit occurs inside a system. In this situation, the electrical coupling between the power-supply unit 10 and the load 200 should be disconnected. As such, the switch unit 20 and the load 200 can be protected, and so lifetime of the switch unit 20 and the load 200 can be prolonged.

Figure 4:
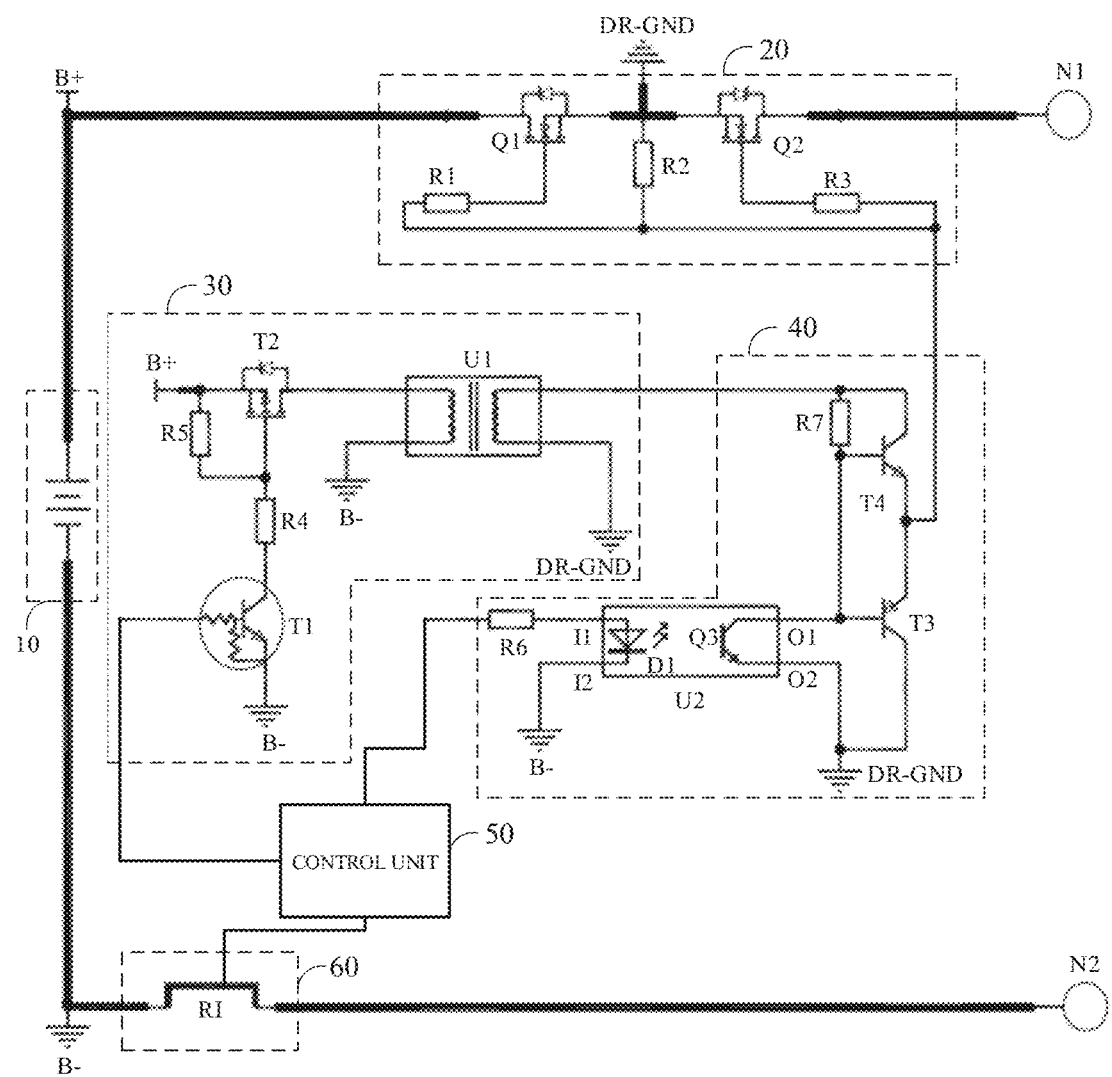
FIG. 4 is a circuit diagram illustrating an NMOS switch driving circuit according to some implementations of the disclosure.

FIG. 4 is a circuit diagram illustrating an NMOS switch driving circuit 100 according to some implementations of the disclosure. As illustrated in FIG. 4, the switch unit 20 includes a first NMOS field effect transistor Q1, a second NMOS field effect transistor Q2, a first resistor R1, a second resistor R2, and a third resistor R3. A gate of the first NMOS field effect transistor Q1 is coupled to the driving unit 40 via the first resistor R1. A drain of the first NMOS field effect transistor Q1 is coupled to a positive electrode of the power-supply unit 10. A source of the first NMOS field effect transistor Q1 is coupled to a reference zero point DR-GND, and is further coupled to the driving unit 40 via the second resistor R2. A gate of the second NMOS field effect transistor Q2 is coupled to the driving unit 40 via the third resistor R3. A source of the second NMOS field effect transistor Q2 is coupled to the reference zero point DR-GND, and is further coupled to the driving unit 40 via the second resistor R2. A drain of the second NMOS field effect transistor Q2 is coupled to the first interface N1.

The reference zero point DR-GND is a zero point relative to the driving voltage of the NMOS driving switch, and is not the actual "ground". For example, a voltage value of the reference zero point may be 1V, 2V, or other voltage values. In the implementation, when the first NMOS field effect transistor Q1 is not switched on, a potential of the reference zero point DR-GND is 0. When the first NMOS field effect transistor Q1 is switched on, the potential of the reference zero point DR-GND is an output voltage of the power-supply unit 10.

It can be understood that, in other implementations, in order to improve overcurrent capability of the switch unit 20, the switch unit 20 may include multiple sets of the first NMOS field effect transistor Q1 and the second NMOS field effect transistor Q2 coupled in parallel, and the number (amount) of the first NMOS field effect transistor Q1 and the number (amount) of the second NMOS field effect transistor Q2 are not limited in the disclosure. Certainly, in some implementations, the switch unit 20 may include only one NMOS field effect transistor.

The power conversion unit 30 includes a first electronic switch T1, a second electronic switch T2, a conversion power supply U1, a fourth resistor R4, and a fifth resistor R5. A control terminal of the first electronic switch T1 is coupled to the control unit 50. A first connection terminal of the first electronic switch T1 is coupled to a negative electrode of the power-supply unit 10. A second connection terminal of the first electronic switch T1 is coupled to a control terminal of the second electronic switch T2 via the fourth resistor R4. A first connection terminal of the second electronic switch T2 is coupled to a positive electrode of the power-supply unit 10. A second connection terminal of the second electronic switch T2 is coupled to a first input terminal of the conversion power supply U1. The control terminal of the second electronic switch T2 is further coupled to the first connection terminal of the second electronic switch T2 via the fifth resistor R5. A second input terminal of the conversion power supply U1 is coupled to a negative electrode of the power-supply unit 10. A first output terminal of the conversion power supply U1 is coupled to the driving unit 40. A second output terminal of the conversion power supply U1 is coupled to a reference zero point.

It can be understood that, the conversion power supply U1 is a regulated power supply having a wide input range, which can convert a fluctuating input voltage into a stable output voltage. For example, the conversion power supply U1 is a direct current-direct current (DC-DC) converter, which can implement boost, buck, boost-buck, buck-boost, bootstrap conversion, etc.

In the implementation, the first electronic switch T1 is an NPN transistor. The control terminal of the first electronic switch T1 corresponds to the base of the NPN transistor. The first connection terminal of the first electronic switch T1 corresponds to the emitter of the NPN transistor. The second connection terminal of the first electronic switch T1 corresponds to the collector of the NPN transistor. In the implementation, the NPN transistor is integrated with a bias resistor.

The second electronic switch T2 is a P-channel metal oxide semiconductor (PMOS) field effect transistor. The control terminal of the second electronic switch T2 corresponds to the gate of the PMOS field effect transistor. The first connection terminal of the second electronic switch T2 corresponds to the source of the PMOS field effect transistor. The second connection terminal of the second electronic switch T2 corresponds to the drain of the PMOS field effect transistor. In the implementation, the PMOS field effect transistor includes a parasitic diode.

The driving unit 40 includes an optocoupler U2, a third electronic switch T3, a fourth electronic switch T4, a sixth resistor R6, and a seventh resistor R7. A first input terminal 11 of the optocoupler U2 is coupled to the control unit 50 via the sixth resistor R6. A second input terminal 12 of the optocoupler U2 is coupled to a negative electrode of the power-supply unit 10. A first output terminal O1 of the optocoupler U2 is coupled to a control terminal of the third electronic switch T3. A second output terminal O2 of the optocoupler U2 is coupled to a reference zero point DR-GND. A first connection terminal of the third electronic switch T3 is coupled to the reference zero point DR-GND. A second connection terminal of the third electronic switch T3 is coupled to a first connection terminal of the fourth electronic switch T4. A control terminal of the fourth electronic switch T4 is coupled to the power conversion unit 30 via the seventh resistor R7. A second connection terminal of the fourth electronic switch T4 is coupled to the power conversion unit 30.

In one implementation, the optocoupler U2 includes a light-emitting element D1 and a light-receiving element Q3. A first terminal of the light-emitting element D1 serves as the first input terminal 11 of the optocoupler U2. A second terminal of the light-emitting element D1 serves as the second input terminal 12 of the optocoupler U2. A first terminal of the light-receiving element Q3 serves as the first output terminal O1 of the optocoupler U2. A second terminal of the light-receiving element Q3 serves as the second output terminal O2 of the optocoupler U2.

In the implementation, the light-emitting element D1 is a light-emitting diode. The first terminal of the light-emitting element D1 corresponds to the anode of the light-emitting diode, and the second terminal of the light-emitting element D1 corresponds to the cathode of the light-emitting diode.

The light-receiving element Q3 is a phototransistor. The first terminal of the light-receiving element Q3 corresponds to the collector of the phototransistor, and the second terminal of the light-receiving element Q3 corresponds to the emitter of the phototransistor.

In the implementation, the third electronic switch T3 is a PNP transistor. The control terminal of the third electronic switch T3 corresponds to the base of the PNP transistor. The first connection terminal of the third electronic switch T3 corresponds to the collector of the PNP transistor. The second connection terminal of the third electronic switch T3 corresponds to the emitter of the PNP transistor. The fourth electronic switch T4 is an NPN transistor. The control terminal of the fourth electronic switch T4 corresponds to the base of the NPN transistor. The first connection terminal of the fourth electronic switch T4 corresponds to the emitter of the NPN transistor. The second connection terminal of the fourth electronic switch T4 corresponds to the collector of the NPN transistor. In other implementations, the third electronic switch T3 may be other switches with similar functions, such as PMOS field effect transistors and insulated gate bipolar transistors (IGBTs). The fourth electronic switch T4 may be other switches with similar functions, such as NMOS field effect transistors and IGBTs.

The current detection unit 60 includes a current sampling resistor R1. In one implementation, both ends of the current sampling resistor R1 can be coupled to the two input terminals of an operational amplifier, and an output voltage amplified by the operational amplifier is used to determine whether a current in the circuit exceeds a preset threshold, which belongs to an existing technology and will not be repeated herein. In other implementations, the current detection unit 60 may further include a current sensor (e.g., a Hall sensor), and the current in the circuit is collected by the current sensor.

Hereinafter, the working principle of the NMOS switch driving circuit 100 described in conjunction with FIG. 4 will be introduced.

When the control unit 50 detects that the load 200 is coupled to the first interface N1 and the second interface N2 and the load 200 needs to be enabled, the control unit 50 outputs a high-level signal to the first electronic switch T1 and outputs a low-level signal to the optocoupler U2. The high-level signal outputted to the first electronic switch T1 is a conversion signal, and the low-level signal outputted to the optocoupler U2 is a driving signal. The first electronic switch T1 is switched on upon receipt of the high-level signal, so that a gate of the second electronic switch T2 is at low level, and so the second electronic switch T2 is switched on. In this case, a first voltage outputted by the power-supply unit 10 is outputted to the conversion power supply U1 via the second electronic switch T2, and the conversion power supply U1 converts the first voltage into a constant driving voltage and outputs the driving voltage.

When the optocoupler U2 receives the low-level signal, the light-emitting element D1 is switched off, and so the light-emitting element D1 does not emit lights. The light-receiving element Q3 is switched off because no light is received, so that a base of the third electronic switch T3 is at high level, and so the third electronic switch T3 is switched off and the fourth electronic switch T4 is switched on. In this case, the driving voltage outputted by the conversion power supply U1 can be outputted to the first NMOS field effect transistor Q1 and the second NMOS field effect transistor Q2, to drive the first NMOS field effect transistor Q1 and the second NMOS field effect transistor Q2 to be switched on, so that the first voltage outputted by the power-supply unit 10 can be outputted to the load 200 to supply power to the load 200.

Figure 5:
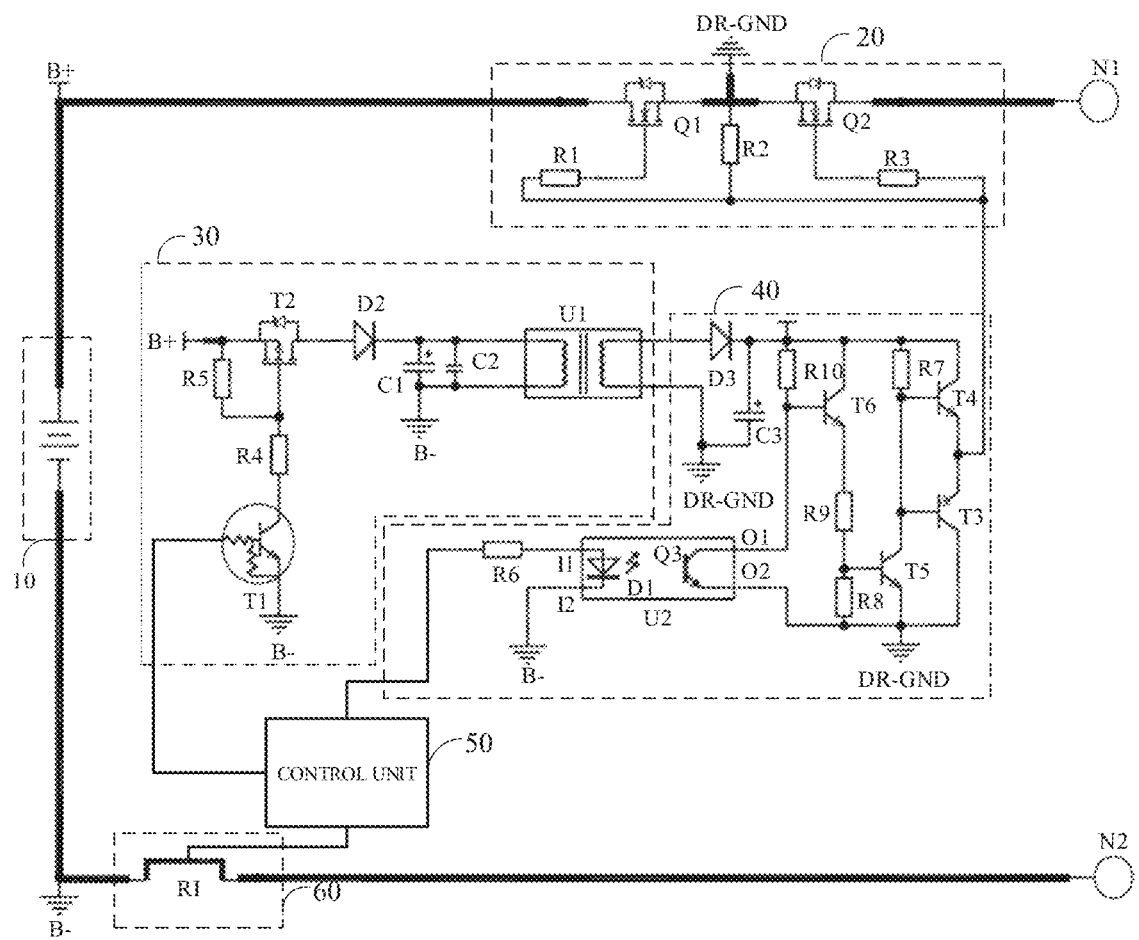
FIG. 5 is a circuit diagram illustrating an NMOS switch driving circuit according to other implementations of the disclosure.

Referring to FIG. 5, in some implementations, the power conversion unit 30 further includes a first diode D2 and at least one capacitor. In the implementation of the disclosure, the power conversion unit 30 includes a first capacitor C1 and a second capacitor C2. An anode of the first diode D2 is coupled to the second connection terminal of the second electronic switch T2. A cathode of the first diode D2 is coupled to the first input terminal of the conversion power supply U1. The first capacitor C1 and the second capacitor C2 are coupled in parallel between the first input terminal of the conversion power supply U1 and a negative electrode of the power-supply unit 10. In this way, when the power-supply unit 10 is instantly powered off, the first capacitor C1 and the second capacitor C2 can continue to supply power to the load 200, which further improves stability of work of the load 200.

The driving unit 40 further includes a second diode D3 and a third capacitor C3. An anode of the second diode D3 is electrically coupled to the first output terminal of the conversion power supply U1. A cathode of the second diode D3 is electrically coupled to the second connection terminal of the fourth electronic switch T4. The third capacitor C3 includes one terminal coupled to the cathode of the second diode D3 and another terminal coupled to a reference zero point DR-GND. In this way, when the conversion power supply U1 breaks down instantaneously, the third capacitor C3 can continue to supply power to the load 200, which further improves stability and reliability of a system.

In addition, in order to prolong lifetime of the optocoupler U2, the driving unit 40 further includes a fifth electronic switch T5, a sixth electronic switch T6, an eighth resistor R8, a ninth resistor R9, and a tenth resistor R10. A control terminal of the fifth electronic switch T5 is coupled to a reference zero point DR-GND via the eighth resistor R8. A first connection terminal of the fifth electronic switch T5 is coupled to the reference zero point DR-GND. A second connection terminal of the fifth electronic switch T5 is coupled to the control terminal of the third electronic switch T3. The control terminal of the fifth electronic switch T5 is further coupled to a first connection terminal of the sixth electronic switch T6 via the ninth resistor R9. A control terminal of the sixth electronic switch T6 is coupled to the first output terminal O1 of the optocoupler U2. The control terminal of the sixth electronic switch T6 is further coupled to the cathode of the second diode D3 via the tenth resistor R10. A second connection terminal of the sixth electronic switch T6 is coupled to the cathode of the second diode D3.

Hereinafter, the working principle of the NMOS switch driving circuit 100 described in conjunction with FIG. 5 will be introduced.

When the control unit 50 detects that the load 200 is coupled to the first interface N1 and the second interface N2 and the load 200 needs to be enabled, the control unit 50 outputs a high-level signal to the first electronic switch T1 and the optocoupler U2, respectively. The high-level signal outputted to the first electronic switch T1 is a conversion signal, and the high-level signal outputted to the optocoupler U2 is a driving signal. The first electronic switch T1 is switched on upon receipt of the high-level signal, so that a gate of the second electronic switch T2 is at low level, and so the second electronic switch T2 is switched on. In this case, a first voltage outputted by the power-supply unit 10 is outputted to the conversion power supply U1 via the second electronic switch T2 and the first diode D2, and the conversion power supply U1 converts the first voltage into a constant driving voltage and outputs the driving voltage. When the power-supply unit 10 is powered off instantaneously, electricity stored in the first capacitor C1 and the second capacitor C2 can continue to supply power to the load 200.

When the optocoupler U2 receives the high-level signal, the light-emitting element D1 emits lights. The light-receiving element Q3 is switched on because the lights are received, so that the sixth electronic switch T6 is switched off, the fifth electronic switch T5 and the third electronic switch T3 are switched off, and the fourth electronic switch T4 is switched on. In this case, the driving voltage outputted by the conversion power supply U1 can be outputted to the first NMOS field effect transistor Q1 and the second NMOS field effect transistor Q2 via the second diode D3, to drive the first NMOS field effect transistor Q1 and the second NMOS field effect transistor Q2 to be switched on, so that the first voltage outputted by the power-supply unit 10 can be outputted to the load 200 to supply power to the load 200. When the power-supply unit at the front end is suddenly powered off, electricity stored in the third capacitor C3 can continue to supply power to the load 200.

In implementations of the disclosure, when there is no need to supply power to the load 200, the optocoupler U2 is in a non-working state. The optocoupler U2 works only when it needs to supply power to the load 200. In this way, lifetime of the optocoupler U2 can be prolonged.

The above implementations are illustrative implementations of the disclosure. It is to be understood that those of ordinary skill in the art are able to make several improvements and modifications without departing from the principles of the disclosure, and these improvements and modifications are also deemed as falling in the protection scope of the disclosure.

What is claimed is:

1. An N-channel metal oxide semiconductor (NMOS) switch driving circuit, applicable to a power supply device equipped with a first interface and a second interface, the NMOS switch driving circuit comprising:
    a power-supply unit configured to output a first voltage;
    a switch unit electrically coupled between the power-supply unit and the first interface and configured to establish or disconnect an electrical coupling between the power-supply unit and the first interface, wherein the switch unit comprises at least one NMOS switch;
    a driving unit configured to drive the switch unit to be switched on based on the first voltage;
    a power conversion unit,
    wherein the power conversion unit comprises a conversion power supply, the conversion power supply is configured to convert the first voltage into a constant driving voltage and output the constant driving voltage to the switch unit via the driving unit to drive the switch unit to be switched on, to establish the electrical coupling between the power-supply unit and the first interface, a first output terminal of the conversion power supply is coupled to the driving unit, a second output terminal of the conversion power supply is coupled to a first reference zero point, and a source of the at least one NMOS switch is coupled to the first reference zero point, and
    wherein the first interface and the second interface are configured to be coupled with a load to supply power to the load, the first interface is a positive interface terminal, the second interface is a negative interface terminal, a negative electrode of the power-supply unit is coupled to the second interface, and a second input terminal of the conversion power supply is coupled to the negative electrode of the power-supply unit.

2. The NMOS switch driving circuit of claim 1, wherein the power conversion unit comprises a port coupled to the power-supply unit and another port electrically coupled to the switch unit via the driving unit; and the NMOS switch driving circuit further comprises:
    a control unit electrically coupled to the power conversion unit and the driving unit, and configured to output a conversion signal to the power conversion unit and output a driving signal to the driving unit;
    wherein
    the power conversion unit is configured to convert the first voltage into the driving voltage according to the conversion signal; and
    the driving unit is configured to output the driving voltage to the switch unit according to the driving signal to drive the switch unit to be switched on.

3. The NMOS switch driving circuit of claim 1, further comprising:
    a current detection unit electrically coupled between the power-supply unit and the second interface, and configured to detect an output current of the power-supply unit, wherein the switch unit is configured to be switched on based on the output current; and
    a control unit electrically coupled to the current detection unit to collect a current signal detected by the current detection unit, and configured to stop outputting a conversion signal for controlling the power conversion unit to work and/or stop outputting a driving signal when the current signal collected by the control unit is greater than a preset threshold.

4. The NMOS switch driving circuit of claim 1, wherein the switch unit is electrically coupled between a first positive electrode of the power-supply unit and the first interface.

5. The NMOS switch driving circuit of claim 1, wherein the power conversion unit further comprises a first electronic switch and a second electronic switch, wherein
    a control terminal of the first electronic switch is coupled to a control unit, a first connection terminal of the first electronic switch is coupled to the negative electrode of the power-supply unit, and a second connection terminal of the first electronic switch is coupled to a control terminal of the second electronic switch; and
    a first connection terminal of the second electronic switch is coupled to a second positive electrode of the power-supply unit, and a second connection terminal of the second electronic switch is coupled to a first input terminal of the conversion power supply.

6. The NMOS switch driving circuit of claim 5, wherein the power conversion unit further comprises a first diode, a first capacitor, and a second capacitor, wherein
    an anode of the first diode is coupled to the second connection terminal of the second electronic switch, and a cathode of the first diode is coupled to the first input terminal of the conversion power supply; and
    the first capacitor and the second capacitor are coupled in parallel between the first input terminal of the conversion power supply and the negative electrode of the power-supply unit.

7. The NMOS switch driving circuit of claim 1, wherein the conversion power supply is a regulated power supply having a wide input range.

8. The NMOS switch driving circuit of claim 1, wherein the driving unit comprises an optocoupler, a third electronic switch, and a fourth electronic switch, wherein a first input terminal of the optocoupler is coupled to a control unit, a second input terminal of the optocoupler is coupled to the negative electrode of the power-supply unit, a first output terminal of the optocoupler is coupled to a control terminal of the third electronic switch, and a second output terminal of the optocoupler is coupled to a second reference zero point;

a first connection terminal of the third electronic switch is coupled to the second reference zero point, a second connection terminal of the third electronic switch is coupled to a first connection terminal of the fourth electronic switch; and a control terminal of the fourth electronic switch is coupled to the power conversion unit, and a second connection terminal of the fourth electronic switch is coupled to the power conversion unit.

9. The NMOS switch driving circuit of claim 8, wherein the driving unit further comprises a second diode and a third capacitor, wherein an anode of the second diode is electrically coupled to the first output terminal of the conversion power supply, and a cathode of the second diode is electrically coupled to the second connection terminal of the fourth electronic switch; and the third capacitor comprises one terminal coupled to the cathode of the second diode and another terminal coupled to the first reference zero point.

10. The NMOS switch driving circuit of claim 8, wherein the optocoupler comprises a light-emitting element and a light-receiving element, wherein a first terminal of the light-emitting element is used as the first input terminal of the optocoupler, and a second terminal of the light-emitting element is used as the second input terminal of the optocoupler; and a first terminal of the light-receiving element is used as the first output terminal of the optocoupler, and a second terminal of the light-receiving element is used as the second output terminal of the optocoupler.

11. The NMOS switch driving circuit of claim 10, wherein the driving unit further comprises a fifth electronic switch and a sixth electronic switch, wherein a control terminal of the fifth electronic switch is coupled to the second reference zero point, a first connection terminal of the fifth electronic switch is coupled to the second reference zero point, a second connection terminal of the fifth electronic switch is coupled to the control terminal of the third electronic switch, and the control terminal of the fifth electronic switch is further coupled to a first connection terminal of the sixth electronic switch; and a control terminal of the sixth electronic switch is coupled to the first output terminal of the optocoupler and the power conversion unit, a second connection terminal of the sixth electronic switch is coupled to the power conversion unit.

12. The NMOS switch driving circuit of claim 1, wherein the driving unit comprises an optocoupler, wherein a first input terminal of the optocoupler is coupled to a control unit, a first output terminal of the optocoupler is coupled to a path for the conversion power supply to supply power to the switch unit, a second output terminal of the optocoupler is coupled to a second reference zero point, and the optocoupler is configured to convert a driving signal to an optical signal, so that the driving voltage outputted by the conversion power supply is outputted to the switch unit.

13. A power supply device, comprising:
a first interface;
a second interface; and
an N-channel metal oxide semiconductor (NMOS) switch driving circuit coupled to a load via the first interface and the second interface and comprising:
  a power-supply unit configured to output a first voltage;
  a switch unit electrically coupled between the power-supply unit and the first interface and configured to establish or disconnect an electrical coupling between the power-supply unit and the first interface, wherein the switch unit comprises at least one NMOS switch;
  a driving unit configured to drive the switch unit to be switched on based on the first voltage;
  a power conversion unit,
  wherein the power conversion unit comprises a conversion power supply, the conversion power supply is configured to convert the first voltage into a constant driving voltage and output the constant driving voltage to the switch unit via the driving unit to drive the switch unit to be switched on, to establish the electrical coupling between the power-supply unit and the first interface, a first output terminal of the conversion power supply is coupled to the driving unit, a second output terminal of the conversion power supply is coupled to a first reference zero point, and a source of the at least one NMOS switch is coupled to the first reference zero point, and
wherein the first interface and the second interface are configured to be coupled with a load to supply power to the load, the first interface is a positive interface terminal, the second interface is a negative interface terminal, a negative electrode of the power-supply unit is coupled to the second interface, and a second input terminal of the conversion power supply is coupled to the negative electrode of the power-supply unit.

14. The power supply device of claim 13, wherein the power conversion unit comprises a port coupled to the power-supply unit and another port electrically coupled to the switch unit via the driving unit; and the NMOS switch driving circuit further comprises:

a control unit electrically coupled to the power conversion unit and the driving unit, and configured to output a conversion signal to the power conversion unit and output a driving signal to the driving unit;
wherein
the power conversion unit is configured to convert the first voltage into the driving voltage according to the conversion signal; and
the driving unit is configured to output the driving voltage to the switch unit according to the driving signal to drive the switch unit to be switched on.

15. The power supply device of claim 13, further comprising:
a current detection unit electrically coupled between the power-supply unit and the second interface, and configured to detect an output current of the power-supply unit, wherein the switch unit is configured to be switched on based on the output current; and
a control unit electrically coupled to the current detection unit to collect a current signal detected by the current detection unit, and configured to stop outputting a conversion signal for controlling the power conversion unit to work and/or stop outputting a driving signal when the current signal collected by the control unit is greater than a preset threshold.

16. The power supply device of claim 13, wherein the switch unit is electrically coupled between a first positive electrode of the power-supply unit and the first interface.

17. The power supply device of claim 13, wherein
the power conversion unit further comprises a first electronic switch and a second electronic switch, wherein
a control terminal of the first electronic switch is coupled to a control unit, a first connection terminal of the first electronic switch is coupled to the negative electrode of the power-supply unit, and a second connection terminal of the first electronic switch is coupled to a control terminal of the second electronic switch; and
a first connection terminal of the second electronic switch is coupled to a second positive electrode of the power-supply unit, and a second connection terminal of the second electronic switch is coupled to a first input terminal of the conversion power supply.

18. The power supply device of claim 13, wherein
the driving unit comprises an optocoupler, a third electronic switch, and a fourth electronic switch, wherein
a first input terminal of the optocoupler is coupled a control unit, a second input terminal of the optocoupler is coupled to the negative electrode of the power-supply unit, a first output terminal of the optocoupler is coupled to a control terminal of the third electronic switch, and a second output terminal of the optocoupler is coupled to a second reference zero point;
a first connection terminal of the third electronic switch is coupled to the second reference zero point, a second connection terminal of the third electronic switch is coupled to a first connection terminal of the fourth electronic switch; and
a control terminal of the fourth electronic switch is coupled to the power conversion unit, and a second connection terminal of the fourth electronic switch is coupled to the power conversion unit.

19. The power supply device of claim 18, wherein
the optocoupler comprises a light-emitting element and a light-receiving element, wherein
a first terminal of the light-emitting element is used as the first input terminal of the optocoupler, and a second terminal of the light-emitting element is used as the second input terminal of the optocoupler; and
a first terminal of the light-receiving element is used as the first output terminal of the optocoupler, and a second terminal of the light-receiving element is used as the second output terminal of the optocoupler.

20. The power supply device of claim 19, wherein
the driving unit further comprises a fifth electronic switch and a sixth electronic switch, wherein
a control terminal of the fifth electronic switch is coupled to the second reference zero point, a first connection terminal of the fifth electronic switch is coupled to the second reference zero point, a second connection terminal of the fifth electronic switch is coupled to the control terminal of the third electronic switch, and the control terminal of the fifth electronic switch is further coupled to a first connection terminal of the sixth electronic switch; and
a control terminal of the sixth electronic switch is coupled to the first output terminal of the optocoupler and the power conversion unit, a second connection terminal of the sixth electronic switch is coupled to the power conversion unit.

* * * * *